United States Patent
Ohashi et al.

(10) Patent No.: US 9,913,419 B2
(45) Date of Patent: Mar. 6, 2018

(54) FEEDER

(71) Applicant: FUJI MACHINE MFG. CO., LTD., Chiryu (JP)

(72) Inventors: Hiroyasu Ohashi, Toyota (JP); Hiroki Murase, Nagoya (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 0 days.

(21) Appl. No.: 15/303,817

(22) PCT Filed: Apr. 14, 2014

(86) PCT No.: PCT/JP2014/060622
§ 371 (c)(1),
(2) Date: Oct. 13, 2016

(87) PCT Pub. No.: WO2015/159346
PCT Pub. Date: Oct. 22, 2015

(65) Prior Publication Data
US 2017/0034970 A1    Feb. 2, 2017

(51) Int. Cl.
H05K 13/04    (2006.01)
H05K 13/02    (2006.01)
B65H 20/22    (2006.01)

(52) U.S. Cl.
CPC ......... H05K 13/0417 (2013.01); B65H 20/22 (2013.01); H05K 13/02 (2013.01)

(58) Field of Classification Search
CPC ........ B65H 20/20; B65H 20/22; H05K 13/02; H05K 13/0417
See application file for complete search history.

(56) References Cited

U.S. PATENT DOCUMENTS

2011/0243695 A1   10/2011   Hwang et al.
2015/0195964 A1   7/2015    Yamasaki
2015/0223373 A1   8/2015    Yamasaki

FOREIGN PATENT DOCUMENTS

| JP | 2011-211169 A | 10/2011 |
| JP | 2012-69669 A | 4/2012 |
| JP | 5521129 B1 | 6/2014 |
| WO | WO 2014/025115 A1 | 2/2014 |
| WO | WO 2014/025120 A1 | 2/2014 |
| WO | 2014/041712 A1 | 3/2014 |

OTHER PUBLICATIONS

International Search Report dated Jul. 1, 2014 in PCT/JP2014/060622 filed Apr. 14, 2014.
Extended European Search Report dated Apr. 7, 2017 in Patent Application No. 14889596.4.

Primary Examiner — William E Dondero
(74) Attorney, Agent, or Firm — Oblon, McClelland, Maier & Neustadt, L.L.P.

(57) ABSTRACT

A feeder is provided with a pushing member that pushes the carrier tape against a rail, an engaging member engageable with indexing holes of the carrier tape, and an interlocking mechanism that moves an engaging member upwards by interlocking with the upwards movement of the pushing member. The engaging member engages with indexing holes of the carrier to restrict the movement of the carrier tape to the insertion section side. The interlocking mechanism separates the engaging member from the indexing holes of the carrier tape by interlocking upwards movement of the engaging member with upwards movement of the pushing member, allowing movement of the carrier tape in the conveyance direction.

6 Claims, 7 Drawing Sheets

FEEDER

TECHNICAL FIELD

The present application relates to a feeder that supplies components by indexing carrier tape that stores the components.

BACKGROUND ART

Feeders are used on component mounters that mount components on circuit boards (patent literature 1). The feeder rotates a sprocket that engages with indexing holes formed at regular intervals in the conveyance direction of the carrier tape so as to index carrier tape inserted into an insertion section in the conveyance direction along a rail. By this, the feeder supplies components to a removal section such that the components can be picked up by a component mounter.

Also, carrier tape is set such that the sprocket is rotated after the carrier tape has been inserted to a specified position at which the sprocket can engage with the indexing holes of the carrier tape. Disclosed in patent literature 2 is a non-splicing feeder that, when replenishing carrier tape to a feeder that is being used by a component mounter, enables continuous supply of components without the need to connect (splice) in-use carrier tape and replenishment carrier tape.

With the non-splicing feeder, replenishment carrier tape is inserted from the insertion section of the feeder to a specified position such that the replenishment carrier tape is on top of the in-use carrier tape. When the tail end of the in-use carrier tape passes the specified position, the replenishment carrier tape is pushed by a rail such that the sprocket engages with the indexing holes. Thus, the replenishment carrier tape is indexed by the rotation of the sprocket.

CITATION LIST

Patent Literature

PTL 1: JP-A-2012-069669
PTL 2: JP-A-2011-211169

SUMMARY

However, when carrier tape is set on the feeder as given above, the carrier tape is in a standby state at the specified position of the feeder waiting for the rotation of the sprocket. Here, if a load is applied on the carrier tape in the removal direction, the carrier tape may fall out of the feeder. The present disclosure takes account of the above issue, and an object thereof is to provide a feeder that prevents carrier tape in a standby state waiting to be indexed from coming out of the feeder.

A feeder comprising: a sprocket that engages with indexing holes formed at regular intervals in a conveyance direction of carrier tape, the sprocket rotating so as to index the carrier tape inserted into an insertion section in the conveyance direction along a rail; a pushing member provided moveably in a vertical direction perpendicular to the conveyance direction that pushes the carrier tape against a rail from an initial position to an upstream position; an engaging member that engages with the indexing holes of the carrier tape at a position further to the insertion section side than a contact portion at which the pushing member contacts the carrier tape; and an interlocking mechanism that moves the engaging member up by interlocking with movement up of the pushing member; wherein the engaging member, when a leading end of the carrier tape is positioned at a position further to the insertion section side than the contact portion and the carrier tape is interposed between the engaging member and the rail, engages with the indexing holes of the carrier tape so as to restrict the movement of the carrier tape to the insertion section side, and the interlocking mechanism, when the pushing member is pushing the carrier tape against the rail, releases the engaging member from the indexing holes of the carrier tape, so as to allow movement of the carrier tape in the conveyance direction, by moving the engaging member up by interlocking with movement up of the pushing member.

According to this configuration, the feeder prevents the carrier tape from coming out by the engaging member engaging with the indexing holes of the carrier tape inserted to a specified position. Thus, carrier tape is reliably held even in a case in which a load is applied on the carrier tape in the removing direction with the feeder in a state waiting to index. Also, in a case in which the pushing member pushes the carrier tape against the rail, the feeder releases the engaging member from the indexing holes of the carrier tape. Accordingly, movement of the carrier tape in the conveyance direction is allowed. Therefore, the engaging member is not used on in-use carrier tape, thus does not obstruct the indexing of in-use carrier tape.

DESCRIPTION OF EMBODIMENTS

Hereinafter, an embodiment of the present disclosure of a feeder is described with reference to the drawings. Feeders are used on component mounters that mount components on circuit boards. Feeders index carrier tape that stores electronic components at regular intervals so that the components are removable at a removal section.

EMBODIMENT

Figure 1:
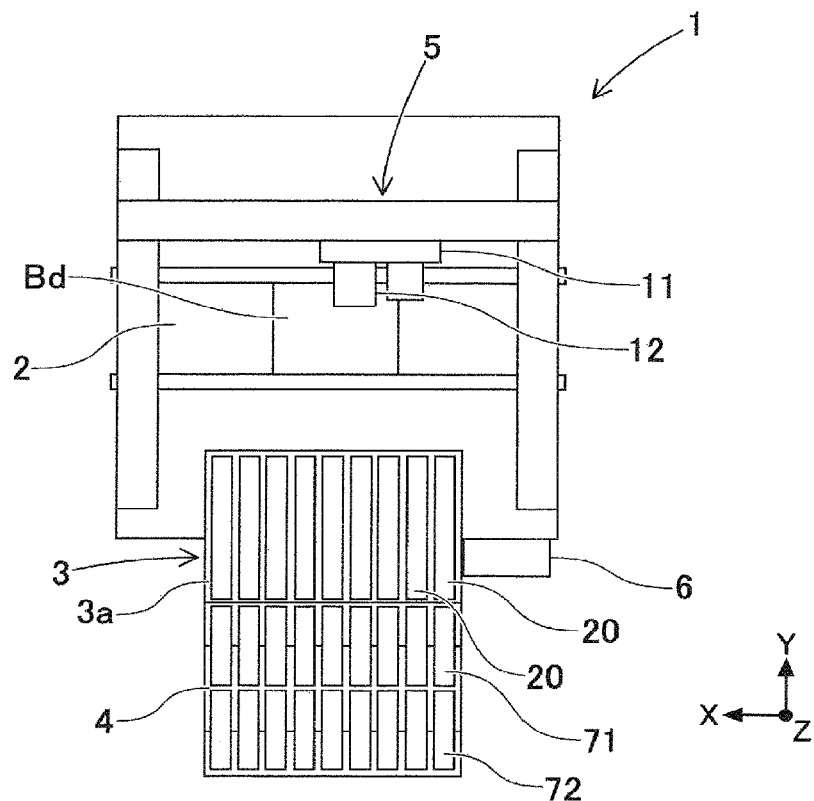
FIG. 1 is a plan view showing an entire view of a component mounter of an embodiment.

Configuration of Component Mounter 1
The configuration of component mounter 1 will be described with reference to FIG. 1. As shown in FIG. 1, component mounter 1 is provided with board conveyance device 2, component supply device 3, reel holding section 4, component transfer device 5, and control device 6. In the descriptions below, the horizontal width direction of component mounter 1 (left-right direction in FIG. 1) is the X-axis direction, the horizontal lengthwise direction of component mounter 1 (up-down direction in FIG. 1) is the Y-axis direction, and the direction perpendicular to the X axis and Y axis (perpendicular to the page in FIG. 1) is the Z-axis direction.

Board conveyance device 2 is configured from a belt conveyor or the like and consecutively conveys board Bd in a conveyance direction. Board conveyance device 2 positions board Bd at a specified position inside component mounter 1. Then, after mounting processing has been performed by component mounter 1, board conveyance device 2 unloads board Bd from component mounter 1.

Component supply device 3 supplies electronics components that are mounted on board Bd. Component supply device 3 includes multiple slots 3a arranged lined up in the X-axis direction. Feeders 20 are removably set in each of the multiple slots 3a. Component supply device 3 supplies electronic components to removal section Nt positioned at the leading end of feeder 20 (the upper side in FIG. 1) by feeder 20 indexing carrier tape 80. The detailed configuration of feeder 20 is described later.

Reel holding section 4 exchangeably holds a first reel 71 and a second reel 72 around which carrier tape 80 is wound. First reel 71 and second reel 72 are arranged lined up in the Y direction with respect to each feeder 20. That is, reel holding section 4 is configured such that carrier tape 80 is able to be supplied to one feeder 20 from first reel 71 and second reel 72.

Component transfer device 5 is configured to move in the X-axis direction and the Y-axis direction. Component transfer device 5 is arranged from the rear side in the lengthwise direction of component mounter 1 (the upper side in FIG. 1) to above component supply device 3 at the front of component mounter 1. Component transfer device 5 is provided with head driving device 11 and mounting head 12. Head driving device 11 is configured to move a moving body in the XY-axis directions using a linear motion mechanism. Mounting head 12 is removably provided on the moving body of head driving device 11.

Also, multiple suction nozzles, which are not shown, are removably provided on mounting head 12. Mounting head 12 supports each suction nozzle so as to be rotatable around an R axis parallel to the Z axis and able to be raised/lowered. The height position and angle of each suction nozzle with respect to mounting head 12 and the state of supply of negative pressure to each suction nozzle is controlled. Each suction nozzle, by being supplied with negative pressure, picks up and holds an electronic component at removal section Nt of feeder 20.

Control device 6 is configured mainly from a CPU, various types of memory, and control circuits. Control device 6 includes a storage device that stores mounting data for operating component mounter 1, and image data transmitted from a component camera and a board camera. Control device 6 performs image processing using the acquired image data. Control device 6 corrects operation of component supply device 3 and component transfer device 5 based on the state of the electronic component and circuit board Bd recognized by the image processing. By this, control device 6 controls mounting processing of component mounter 1.

Configuration of Carrier Tape 80

Figure 2:
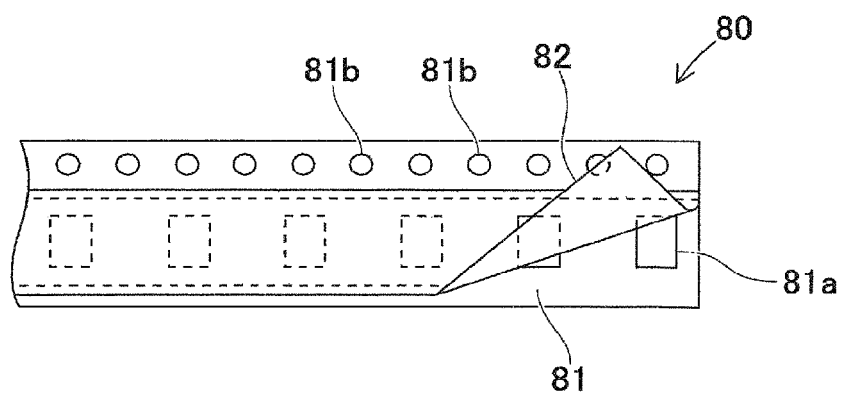
FIG. 2 is a plan view of a portion of carrier tape.

The configuration of carrier tape 80 is described with reference to FIG. 2. As described above, carrier tape 80 is wound around first reel 71 and second reel 72 held in reel holding section 4. Carrier tape 80 stores many components, such as electronic components, arranged in a line. As shown in FIG. 2, carrier tape 80 includes base tape 81 and cover tape 82.

Base tape 81 is formed of a flexible material such as paper or resin. Base tape 81 is provided with component storage sections 81a formed at a center section in the width direction (up-down direction in FIG. 2). Component storage sections 81a are a recess with a bottom. Component storage sections 81a are formed at regular intervals in the conveyance direction (lengthwise direction, left-right direction in FIG. 2) of base tape 81. One component is stored in each of the component storage sections 81a.

Also, base tape 81 includes indexing holes 81b formed at an edge section in the width direction of base tape 81. Indexing holes 81b are formed at regular intervals in the conveyance direction of base tape 81. Indexing holes 81b are formed so as to pierce through carrier tape 80 in the up-down direction (the thickness direction of carrier tape 80). In the present embodiment, the interval between respective indexing holes 81b is set to be smaller than the interval between respective component storage sections 81a.

Cover tape 82 is formed from a thin polymer film. Both sides of cover tape 82 in the width direction are attached to the upper surface of base tape 81. By this, cover tape 82 covers the openings of component storage sections 81a. With carrier tape with this kind of configuration, components stored in component storage sections 81a of base tape 81 are prevented from falling out.

Configuration of Feeder 20

The configuration of feeder 20 will be described with reference to FIG. 3. Feeder 20 is set in slot 3a of component supply device 3, and carrier tape 80 is supplied from first reel 71 and second reel 72 held on reel holding section 4. Feeder 20 supplies components by indexing carrier tape 80 inserted from insertion section Ni such that components are able to be removed from removal section Nt.

In the present embodiment, feeder 20 is a non-splicing feeder capable of continuous supply of components without the need to connect (splice) carrier tape 80 in use and replenishment carrier tape. In detail, feeder 20 holds replenishment carrier tape 80 (hereinafter also referred to as "replenishment tape T2") in a standby state on top of in-use carrier tape 80 (hereinafter also referred to as "conveyance tape T1"). Then, when conveyance tape T1 reaches the end, indexing of replenishment tape T2 is started such that replenishment tape T2 follows the tail end of conveyance tape T1.

Conveyance tape T1 corresponds to the "first carrier tape" of the present disclosure. Replenishment tape T2 corresponds to the "second carrier tape" of the present disclosure. Conveyance tape T1 and replenishment tape T2 are carrier tapes 80 that store the same type of component. Also, replenishment tape T2 becomes in-use carrier tape 80 (conveyance tape T1) when indexing by feeder 20 starts.

Figure 3:
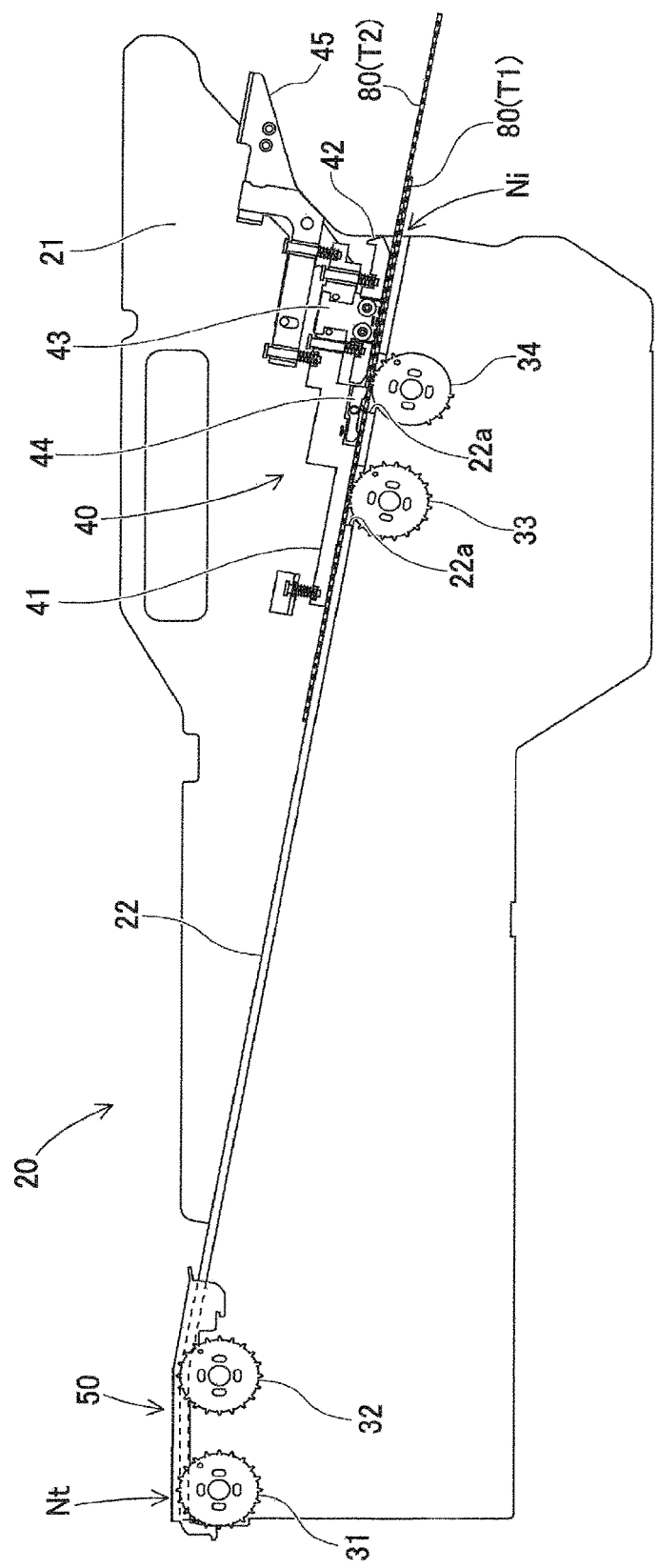
FIG. 3 shows an entire feeder.

As shown in FIG. 3, feeder 20 is provided with case 21, rail 22, multiple sprockets 31 to 34, tape indexing unit 40, and tape peeling unit 50. Case 21 is formed in a flat box shape, and is fixed in position by being inserted into slot 3a of component supply device 3. Rail 22 is provided from insertion section Ni at the rear section of case 21 to removal section Nt at the front section of case 21. The upper surface of rail 22 configures a portion of the conveyance path of carrier tape 80.

Feeder 20 is provided with multiple sprockets 31 to 34 that are rotatable above rail 22. Teeth that engage with indexing holes 81b of carrier tape 80 are provided on the outer circumferential surface of each sprocket 31 to 34. A portion of the teeth of each sprocket 31 to 34 protrude to the upper surface of rail 22 from a window section formed in rail 22.

Each sprocket 31 to 34 is rotated by a stepping motor, which is not shown. Also, each sprocket 31 to 34 is configured to be able to be rotated synchronously by controlling the operation of servo motors. Below, the sprockets of feeder 20 are referred to as, from the front, first sprocket 31, second sprocket 32, third sprocket 33, and fourth sprocket 34.

Tape indexing unit 40 is arranged above rail 22 at which third sprocket 33 and fourth sprocket 34 are positioned in the conveyance direction of carrier tape 80. Tape indexing unit 40 pushes carrier tape 80 positioned within rail 22 against rail 22. By this, tape indexing unit 40 assists third sprocket 33 and fourth sprocket 34 to engage with indexing holes 81b of carrier tape 80.

In this way, tape indexing unit 40 indexes carrier tape 80 along rail 22 towards removal section Nt at the rear section of feeder 20. Also, tape indexing unit 40 has a function to hold replenishment tape T2 inserted in advance with respect to conveyance tape in use T1. Detailed configuration and operation of tape indexing unit 40 is described later.

Tape peeling unit 50 is arranged above rail 22 at which first sprocket 31 and second sprocket 32 are positioned in the conveyance direction of carrier tape 80. Tape peeling unit 50 peels cover tape 82 of indexed carrier tape 80 from base tape 81 such that components are exposed at removal section Nt. Also, tape peeling unit 50 guides cover tape 82 peeled from base tape 81 to an ejection duct.

Figure 4:
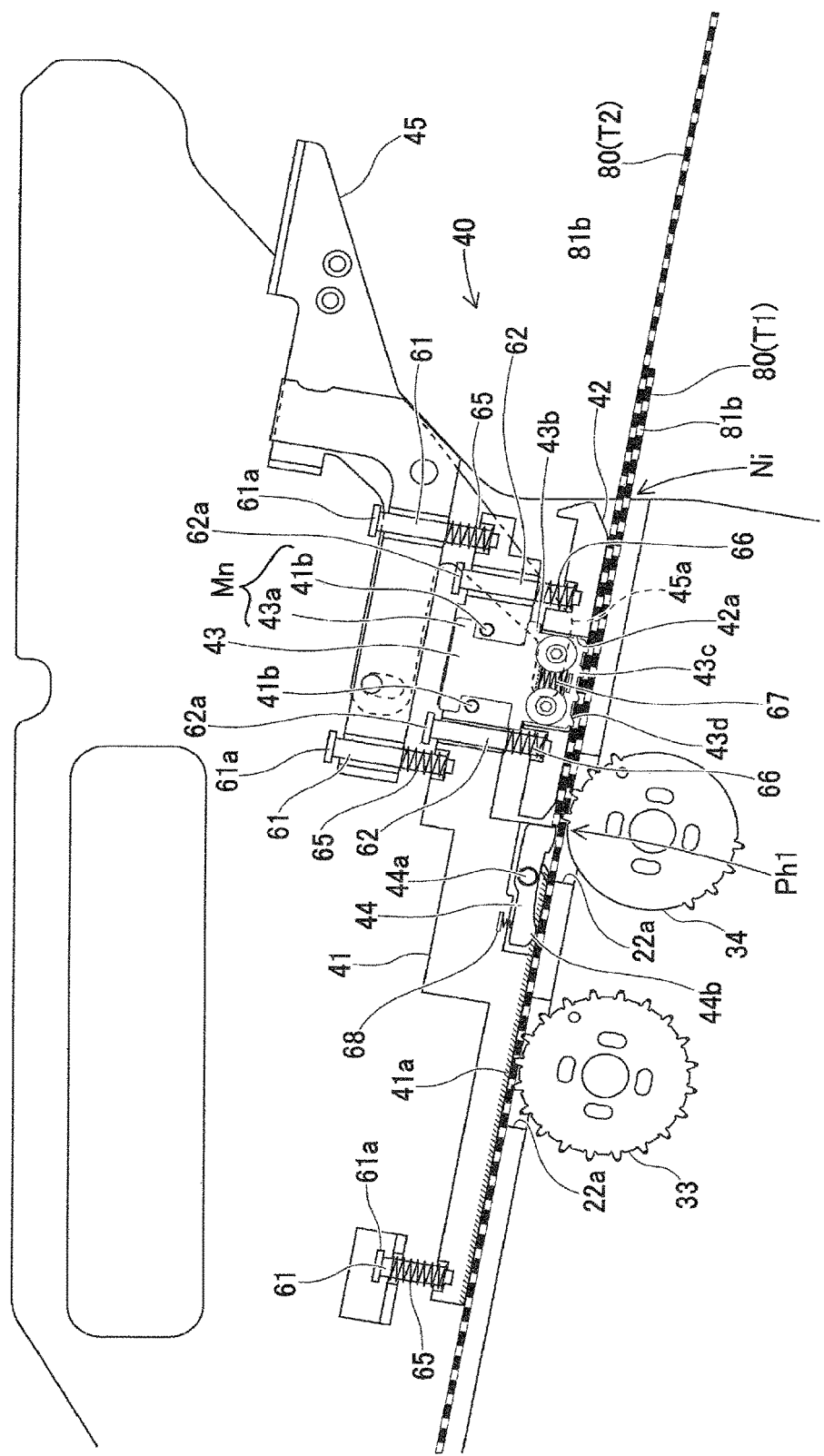
FIG. 4 is an enlarged view showing the tape indexing unit of the feeder of FIG. 3.
Figure 5:
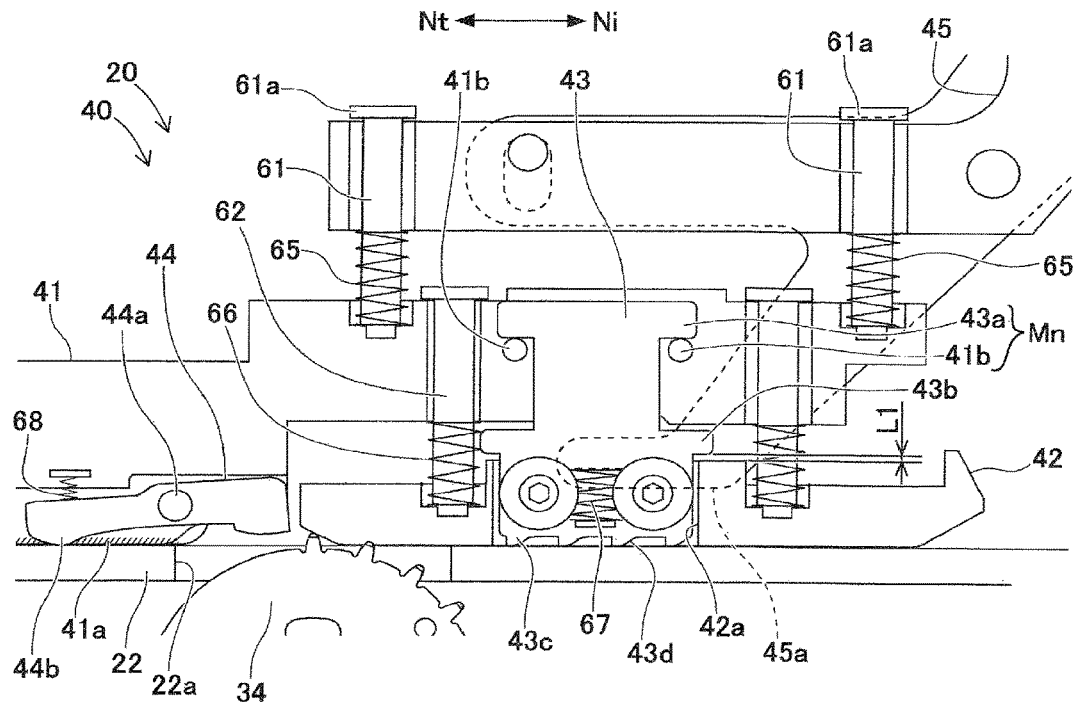
FIG. 5 shows the initial state of the tape indexing unit.

Detailed configuration of tape indexing unit 40 The detailed configuration of tape indexing unit 40 of feeder 20 will be described referring to FIGS. 4 and 5. Note that, FIG. 4 shows a state in which tape indexing unit 40 is holding carrier tape 80 (conveyance tape T1 and replenishment tape T2). FIG. 5 shows an initial state in which carrier tape 80 has not been inserted into tape indexing unit 40. Tape indexing unit 40 is provided with pushing member 41, assisting member 42, engaging member 43, stopper member 44, release lever 45 (which corresponds to the "releasing member" of the present disclosure).

Pushing member 41 pushes carrier tape 80 against rail 22. Pushing member 41 is formed as a block. Pushing member 41 is provided to be relatively movable with respect to case 21 in a vertical direction perpendicular to the conveyance direction via first shafts 61. First coil springs 65 are provided on the outside of first shafts 61 and are arranged coaxial to first shafts 61. Pushing member 41 is biased downwards by the elastic force of first coil springs 65.

Flange 61a is provided on an upper section of first shaft 61. Pushing member 41 is fixed to a lower section of first shaft 61. The shaft section of first shaft 61 runs through a shaft hole formed in case 21. According to such a configuration, downward movement of pushing member 41 is restricted by flange 61a of first shaft 61 being stopped by case 21. Also, pushing member 41 pushes carrier tape 80 against rail 22 when at a position (also referred to as push position Pv2) moved up from initial position Pv1 (refer to FIG. 9).

Here, out of the lower surface of pushing member 41, the portion that contacts carrier tape 80 when pushing member exerts a force on carrier tape 80 is defined as "contact portion 41a" (the portion indicated by the shaded area in FIG. 4). Also, pushing member 41, in an initial in which carrier tape is not being pushed against rail 22, is positioned contacting the upper surface of rail 22, or separated by only a specified distance from the upper surface of rail 22. The above "initial position Pv1" corresponds to the vertical position of pushing member 41 in the initial state (the state in which flange 61a of first shaft 61 is being stopped by case 21).

Assisting member 42 pushes carrier tape 80 against rail 22 at a position further to the insertion section Ni side than contact portion 41a at which pushing member 41 contacts carrier tape 80. Assisting member 42 is formed as a block. Assisting member 42 is provided to be relatively movable with respect to pushing member 41 in a vertical direction via second shafts 62. Second coil springs 66 are provided on the outside of second shafts 62 and are arranged coaxial to second shafts 62. Assisting member 42 is biased downwards by the elastic force of second coil springs 66.

Flange 62a is provided on an upper section of second shaft 62. Assisting member 42 is fixed to a lower section of second shaft 62. The shaft section of second shaft 62 runs through a shaft hole formed in pushing member 41. According to such a configuration, downward movement of assisting member 42 is restricted by flange 62a of second shaft 62 being stopped by pushing member 41. That is, assisting member 42 is set as the downward movement final end position with respect to pushing member 41.

Also, slide groove 42a, which is a recess extending in the vertical direction, is formed in an end surface of assisting member 42 in the widthwise direction (the direction perpendicular to the page in FIG. 5) of rail 22. Sliding groove 42a has parallel groove side surfaces and extends in a direction perpendicular to the conveyance direction. Also, third coil spring 67 is accommodated in the groove bottom section of sliding groove 42a so as to be expandable and retractable in a vertical direction.

Engaging member 43 is engageable with indexing holes 81b of carrier tape 80 at a position further to the insertion section Ni side than contact portion 41a at which pushing member 41 contacts carrier tape 80. In the embodiment, engaging member 43 is provided on assisting member 42 so as to be engageable with indexing holes 81b of carrier tape 80 in the range (contact range Rc shown in FIG. 9) in the conveyance direction in which assisting member 42 contacts carrier tape 80.

Specifically, in the embodiment, engaging member 43 is formed from a plate with a thickness slightly smaller than the diameter of indexing holes 81b. Engaging member 43 is arranged on sliding groove 42a of assisting member 42, and is provided to be slidable with respect to assisting member 42 in a vertical direction. Also, engaging member 43 is biased downwards by the elastic power of third coil spring 67 stored in the groove bottom section of assisting member 42.

First rim section 43a that protrudes both ways in the conveyance direction is formed on the top section of engaging member 43. First rim section 43a, when engaging member 43 has moved down due to the biasing force of third coil spring 67, as shown in FIG. 5, is stopped by cylindrical protruding sections 41b provided on one end surface of pushing member 41 in the width direction of rail 22.

By this, engaging member 43, due to the positional relationship between first rim section 43a and protruding sections 41b, is set at a downward movement final end position with respect to pushing member 41. In the embodiment, the downward movement final end position of engaging member 43 with respect to pushing member 41 is set such that the lower end (the tip of claw 43c described later) of engaging member 43 matches contact portion 41a of pushing member 41 in the vertical direction or is higher than contact portion 41a.

Second rim section 43b that protrudes both ways in the conveyance direction is formed on a center section in the vertical direction of engaging member 43. The lower end of second rim section 43b, in a state with assisting member 42 at the downward movement final end position with respect to pushing member 41, as shown in FIG. 5, is arranged so that a gap of stipulated amount L1 arises with the upper surface of assisting member 42.

By this, second rim section 43b, when assisting member 42 is moved relatively up with respect to pushing member 41 by stipulated amount L1, contacts the upper surface of assisting member 42. Engaging member 43, in a state with second rim section 43b contacting the upper surface of assisting member 42, moves up together with assisting member 42 in accordance with the upwards movement of assisting member 42.

Multiple claws 43c that engage with indexing holes 81b of carrier tape 80 are formed on the lower end of engaging member 43. Multiple claws 43c are arranged at the same interval as indexing holes 81b of carrier tape 80. Also, the tips of the multiple claws 43c, in a state with engaging member 43 at the downward movement final end position with respect to pushing member 41, is positioned lower than the lower surface of assisting member 42 by specified amount Tr (not shown) or is positioned at the same height as the lower surface of assisting member 42 (specified amount Tr=0).

The tips of multiple claws 43c, in a state with second rim section 43b contacting the upper surface of assisting member 42, protrude below the lower surface of assisting member 42. Here, the protrusion amount of the tips of claws 43c is set to be smaller than the thickness of carrier tape 80. This protrusion amount is equivalent to the difference (L1−Tr) between the distance between the bottom end of second rim section 43b and the upper surface of assisting member 42 (stipulated amount L1), and the tips of claws 43c of engaging member 43 at the downwards movement final end position (specified amount Tr).

According to such a configuration, engaging member 43, when positioned further to the insertion section Ni side to which the leading end of carrier tape 80 is inserted than contact portion 41a at which pushing member 41 contacts carrier tape 80, and with carrier tape 80 interposed between engaging member 43 and rail 22, engages with indexing holes 81b of carrier tape 80 an amount based on specified amount L1.

Specifically, when the tips of claws 43c of engaging member 43 positioned at the downwards movement final end position are at the same height as the lower surface of assisting member 42 (when specified amount Tr=0), engaging member 43 engages indexing holes 81b of carrier tape 80 by specified amount L1. Accordingly, engaging member 43 restricts movement of carrier tape 80 to the insertion section Ni side.

Also, in the embodiment, inclined surface 43d, which inclines downwards at the portion on insertion section Ni that contacts carrier tape 80 to be indexed in a state engaged with indexing holes 81b of carrier tape 80, is formed on claw section 43c. Inclined surface 43d of engaging member 43 is formed such that a normal line perpendicular to inclined surface 43d faces downwards (towards rail 22).

According to such a configuration, in a case in which carrier tape 80 is taken out and indexed to removal section Nt and a load is applied in the conveyance direction at the contact point with carrier tape 80, a portion of the load is converted into upwards load. By this, engaging member 43 is moved upwards against the biasing force of third coil spring 67. That is, the configuration is such that engaging member 43, in a state with claws 43c engaged with indexing holes 81b of carrier tape 80, restricts the movement of carrier tape 80 to the insertion section Ni side, but does not restrict the movement of carrier tape 80 to the removal section Nt section.

Stopper member 44, for replenishment tape T2 inserted on top of conveyance tape T1, decides the position of the leading end of replenishment tape T2. Stopper member 44 is formed as a block. Rotation shaft 44a is formed on a center portion of stopper member 44 in the length direction (the conveyance direction of carrier tape 80, which is the left-right direction in FIG. 5). Stopper member 44 is supported on pushing member 44 so as to be rotatable around an axis line of rotation shaft 44a.

Projecting section 44b that contacts the upper surface of conveyance tape T1 that is within rail 22 is formed on a lower section of stopper 44a on the removal section Nt side. Fourth spring 68 is provided on an upper section of stopper member 44 on the removal section Nt side within pushing member 41. Stopper member 44 is biased by the elastic force of fourth spring 68 such that projecting section 44b approaches rail 22.

When conveyance tape T1 is indexed between projecting section 44b and rail 22, stopper member 44 rotates against the elastic force of fourth spring 68. Thus, the end of stopper member 44 on the insertion section Ni side approaches the upper surface of conveyance tape T1. Here, the distance between the end of stopper member 44 on the insertion section Ni side and the upper surface of conveyance tape T1 is smaller than the thickness of replenishment tape T2.

Accordingly, the end of stopper member 44 at the insertion section Ni side contacts the leading end of replenishment tape T2, thus restricting the movement of replenishment tape T2. At this time, the leading end of replenishment tape T2, by contacting stopper member 44, is positioned at specified position Ph1 in the conveyance direction. Also, as shown in FIG. 4, specified position Ph1 is positioned further to the removal section Nt side in the conveyance direction of carrier tape 80 than the rotation center of fourth sprocket 34.

Release lever 45 receives operation force so as to forcibly move up the engaging member such that engagement of engaging member 43 with indexing holes 81b of carrier tape 80 is released. Release lever 45 is rotatably supported on case 21. The end of release lever 45 is biased by the elastic force of a torsion spring, which is not shown, in a rotation direction such that the end of release lever 45 at the insertion section Ni side is moved up.

Release lever 45 includes leg sections 45a that extend in an opposite direction to the operation section that receives an operation, sandwiching the rotation axis of release lever 45. Leg sections 45a are connected to assisting member 42 via a shaft member. Thus, in the embodiment, release lever 45 is indirectly connected to engaging member 43 via assisting member 42. According to such a configuration, when operation force is applied downwards on release lever 45, release lever 45 rotates around an axis line of the rotation shaft. Accordingly, assisting member 42 connected to leg section 45a and leg section 45a moves up.

When this occurs, the lower end of second rim section 43b of engaging member 43 contacts the upper surface of assisting member 42 and engaging member 43 moves up together with assisting member 42. By this, release lever 45 causes claws 43 of engaging member 43 to release from indexing holes 81b of carrier tape 80. When operation force is applied to release lever 45 in this manner, regardless of the state of pushing member 41, engaging member 43, or carrier tape 80, movement of carrier tape 80 in the conveyance direction is allowed.

Operation of Tape Indexing Unit 40

Operation of tape indexing unit 40 will be described referring to FIGS. 5 to 11. Here, as above, pushing member 41, assisting member 42, and engaging member 43 are relatively movable in the vertical direction and configured such that operation of a portion of each is linked to the others. Specifically, assisting member 42 is set as the downward movement final end position with respect to assisting member 42. That is, in a state with flange 62a of second shaft 62 contacting the upper surface of pushing member 41, assisting member 42 moves up with the upwards movement of pushing member 41.

Also, engaging member 43 is set as the downward movement final end position with respect to pushing member 41 and assisting member 42. That is, with first rim section 43a being stopped by protruding sections 41b of pushing member 41, engaging member 43 moves up with the upwards movement of pushing member 41. Further, with second rim section 43b contacting the upper surface of assisting member 42, engaging member 43 moves up with the upwards movement of assisting member 42. In this manner, with the embodiment, feeder 20 is provided with an interlocking mechanism configured from members that include protruding sections 41b and first rim section 43a.

Positional relationships of each member of tape indexing unit 40 in an initial position in which carrier tape 80 has not been inserted into feeder 20 are shown in FIG. 5. Specifically, pushing member 41 and assisting member 42 are positioned contacting the upper surface of rail 22 or with a slight gap from rail 22. Also, engaging member 43 is positioned such that first rim section 43a is stopped by protruding sections 41b of pushing member 41. By this, the tips of multiple claws 43c of engaging member 43 are positioned lower than the lower surface of assisting member 42.

Next, when the first carrier tape 80 (conveyance tape T1) is inserted into insertion section Ni, the leading end of conveyance tape T1 contacts the insertion surface formed on the end of assisting member 42 on the insertion section Ni side. When conveyance tape T1 is inserted further, assisting member 42 moves up with respect to pushing member 41. When assisting member 42 has moved up by stipulated amount L1, the upper surface of assisting member 42 contacts second rim section 43b of engaging member 43. Stipulated amount L1, for the initial state of feeder 20, corresponds to the distance between the lower end of second rim section 43b of engaging member 43 and the upper surface of assisting member 42.

Figure 6:
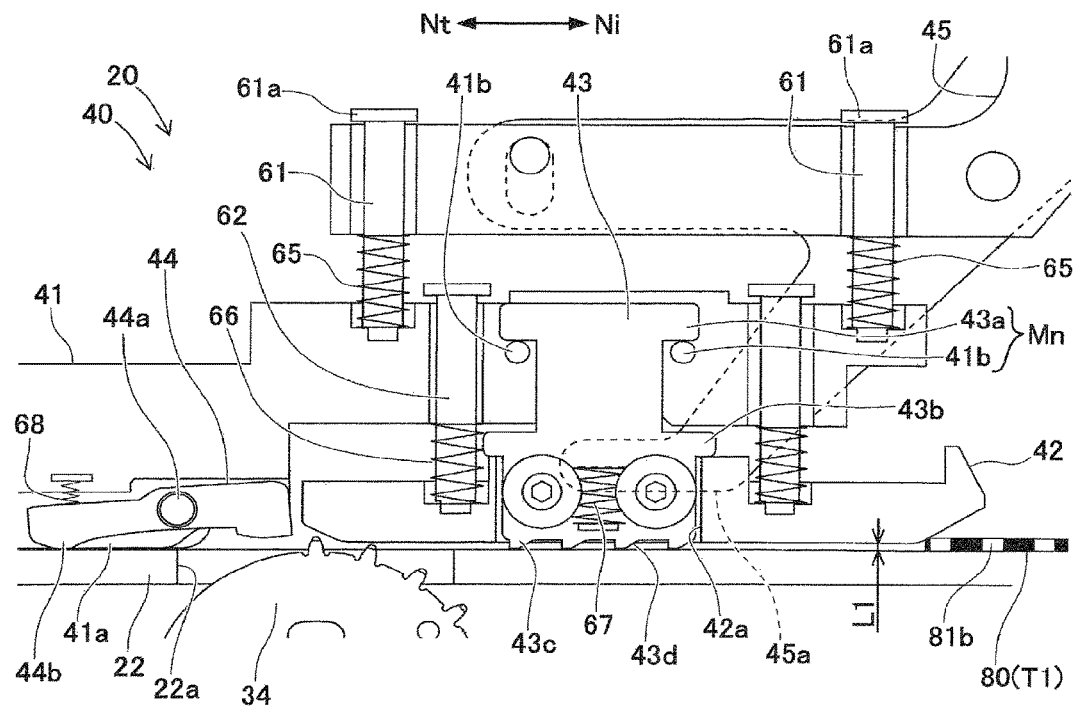
FIG. 6 shows a state with inserted carrier tape contacting the assisting member.

Also, as shown in FIG. 6, second rim section 43b of tape indexing unit 40 moves engaging member 43 up by the upwards movement after assisting member 42 has been moved up relatively with respect to pushing member 41 by stipulated amount L1. Here, the tip of multiple claws 43c of engaging member 43 protrudes down from the lower surface of assisting member 42 by exactly the amount of stipulated amount L1.

The protrusion amount of the tip of claws 43c is set to be smaller than the thickness of conveyance tape T1, in the embodiment being approximately ¼ of the thickness of conveyance tape T1. When conveyance tape T1 is inserted further, assisting member 42 is moved up to a position at which the lower surface of assisting member 42 is separated from the upper surface of rail 22 by the thickness of conveyance tape T1. By this, conveyance tape T1 is pushed against rail 22 by assisting member 42.

When conveyance tape T1 is inserted further, the leading end of conveyance tape T1 contacts claws 43c of engaging member 43. When conveyance tape T1 is indexed further in the conveyance direction, engaging member 43 receives load from conveyance tape T1 at inclined surface 43d, and moves up against the elastic force of third coil spring 67. Then, each claw 43c of engaging member 43 engages from above with indexing holes 81b of conveyance tape T1.

Figure 7:
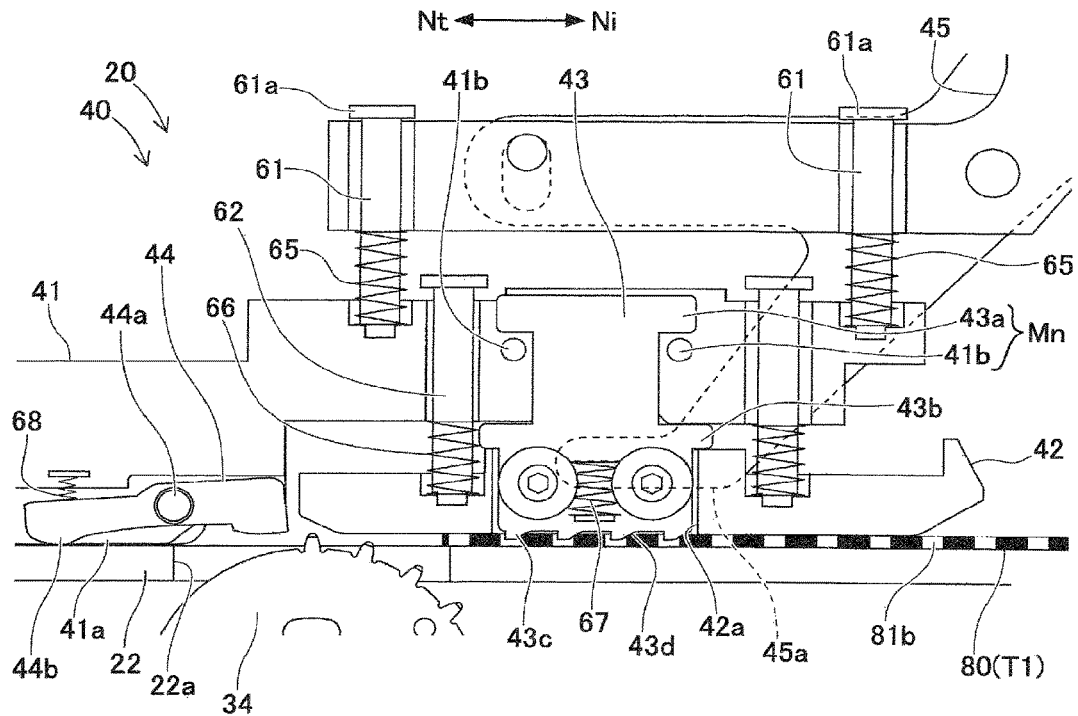
FIG. 7 shows a state with an inclined surface of the engaging member contacting the carrier tape.
Figure 8:
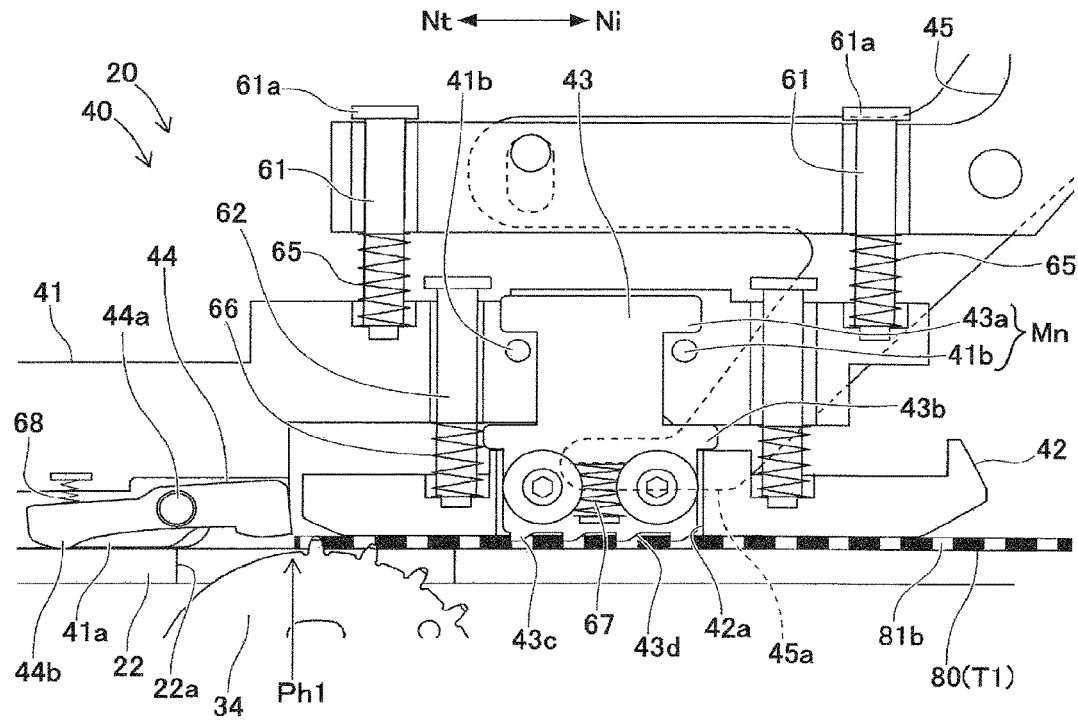
FIG. 8 shows conveyance tape T1 in a state prevented from coming out.

When conveyance tape T1 is inserted further from this state, as shown in FIG. 7, engaging member 43 repeatedly moves up and down due to the load from indexing holes 81b and the elastic force of third coil spring 67. Continuing, as shown in FIG. 8, when the leading end of conveyance tape T1 is moved to specified position Ph1, fourth sprocket 34 engages with indexing holes 81b of conveyance tape T1 from below. By this, conveyance tape T1 is able to be indexed in the conveyance direction by the rotation of fourth sprocket 34.

When fourth sprocket 34 is rotated, conveyance tape T1 is indexed to be between pushing member 41 and rail 22. When this occurs, pushing member 41 moves up with respect to rail 22. When pushing member 41 has moved up a specified amount, protruding sections 41b of pushing member 41 contact first rim section 43a of engaging member 43. In the embodiment, the above "specified amount" corresponds to the protrusion amount of claws 43c that protrude from the lower surface of assisting member 42.

Figure 9:
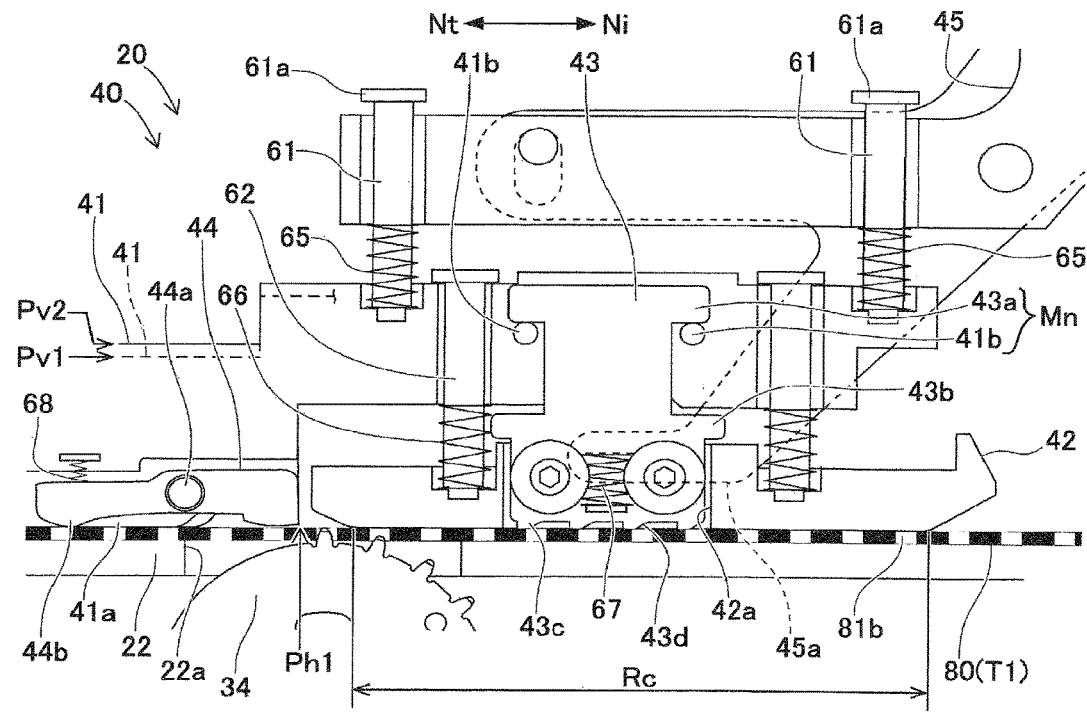
FIG. 9 shows conveyance tape T1 in a state being indexed.

When pushing member 41 is moved up further by the indexing of conveyance tape T1, as shown in FIG. 9, engaging member 43 moves up by interlocking with the upwards movement of pushing member 41. By this, claws 43c of engaging member 43 separate from indexing holes 81b of conveyance tape T1. Also, pushing member 41 pushes conveyance tape T1 against rail 22 from initial position Pv1 to pushing position Pv2 (position at which the lower surface of pushing member 41 is separated from upper surface of rail 22 by the thickness of conveyance tape T1) to which pushing member 41 is moved up.

In this manner, interlocking mechanism Mn of tape indexing unit 40, in a case as shown in FIG. 9 where pushing member 41 pushes conveyance tape T1 against rail 22, interlocks with the upwards movement of pushing member 41 and moves engaging member 43 upwards. Accordingly, interlocking mechanism Mn separates claws 43c of engaging member 43 from indexing holes 81b of conveyance tape T1, to allow movement in the conveyance direction of conveyance tape T1.

Conveyance tape T1 is indexed towards the removal section Nt side along rail 22 by the rotation of third sprocket 33 and fourth sprocket 34 that are positioned below tape indexing unit 40. When conveyance tape T1 has been indexed to the front section side of feeder 20, indexing holes 81b of indexing tape T1 engage with first sprocket 31 and second sprocket 32. Then, feeder 20 controls the rotation of each sprocket 31 to 34 such that components are supplied to be removable from removal section Nt.

Here, when conveyance tape T1 is indexed between pushing member 41 and rail 22, as shown in FIG. 9, conveyance tape T1 contacts projecting section 44b of stopper member 44. By this, stopper member 44 rotates against the elastic force of fourth spring 68. When this occurs, the end of stopper member 44 on the insertion section Ni side approaches the upper surface of conveyance tape T1. At this time, the distance between the end of stopper member 44 on the insertion section Ni side and the upper surface of conveyance tape T1 is smaller than the thickness of replenishment tape T2.

Figure 10:
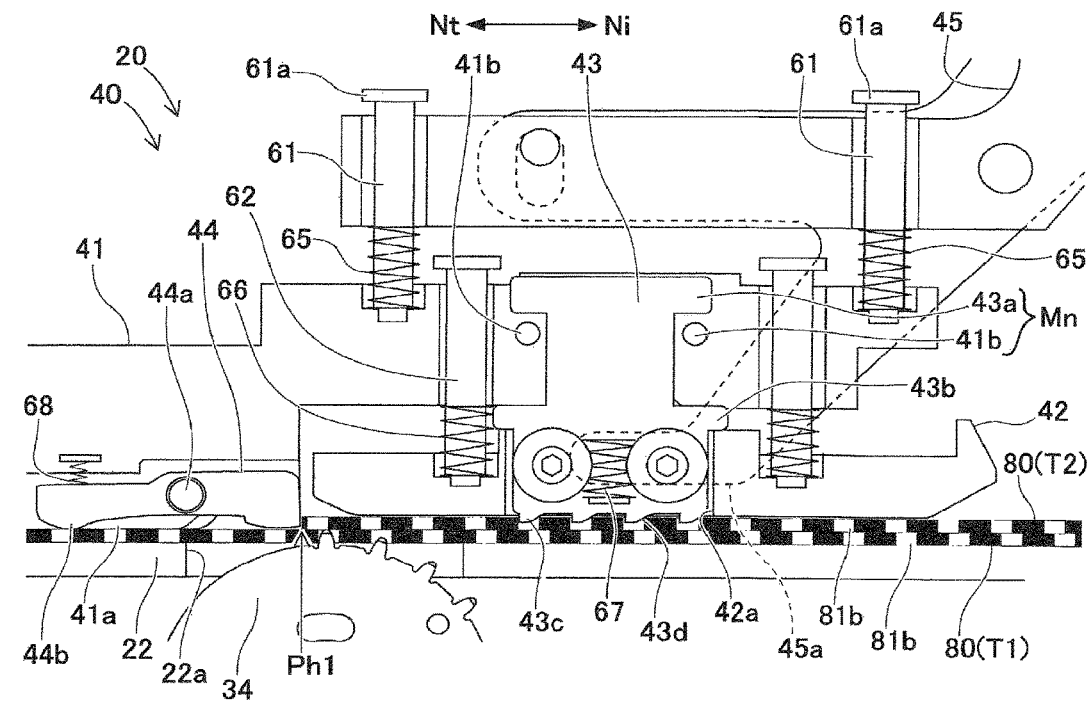
FIG. 10 shows replenishment tape T2 in a state prevented from coming out.

Continuing, when the second carrier tape 80 (replenishment tape T2) is inserted from insertion section Ni, pushing member 41, assisting member 42, and engaging member 43 operate in the same manner as to when conveyance tape T1 was inserted, and have a positional relationship as shown in FIG. 10. When the leading end of replenishment tape T2 approaches stopper member 44, replenishment tape T2 becomes positioned in the conveyance direction at specified position Ph1. The movement of replenishment tape T2 towards the removal section Nt side is restricted by stopper member 44, and replenishment tape T2 is on top of conveyance tape T1 in a standby state waiting to be indexed.

In a case as above in which the leading end of replenishment tape T2 is positioned further towards the insertion section Ni side than contact portion 41a at which conveyance tape T1 contacts pushing member 41, and replenishment tape T2 is interposed between engaging member 43 and rail 22, engaging member 43 engages with indexing holes 81b of replenishment tape T2 such that movement of replenishment tape T2 towards the insertion section Ni side is restricted. In other words, when assisting member 42 is positioned higher than pushing member 41 by the thickness of carrier tape 80, engaging member 43 engages with indexing holes 81b of carrier tape 80, thereby restricting the movement of carrier tape 80 towards the insertion section Ni side.

Then, when the leading end of conveyance tape T1 passes specified position Ph1 of tape indexing unit 40, replenishment tape T2 is pushed against the upper surface of rail 22 by assisting member 42. Here, assisting member 42 moves down to a position such that the lower surface of assisting member 42 is separated from the upper surface of rail 22 by the thickness of replenishment tape T2. Here, at a point while engaging member 43 is moving downwards with assisting member 42, first rim section 43a is stopped by protruding sections 41b.

By this, the positional relationships of each member of tape indexing unit 40 are that shown in FIG. 9. Specifically, the tips of multiple claws 43c of engaging member 43 are positioned higher than the lower surface of assisting member 42. That is, claws 43c of engaging member 43 separate from indexing holes 81b of replenishment tape T2 as it moves down. By this, replenishment tape T2 is allowed to be indexed in the conveyance direction.

Also, when replenishment tape T2 has moved down to a position at which it contacts the upper surface of rail 22, indexing holes 81b of replenishment tape T2 are in a state able to engage with fourth sprocket 34. Further, the leading end of replenishment tape T2 is positioned lower than the end of stopper member 44 on the insertion section Ni side, such that restriction of movement towards the removal section Nt side is released. Accordingly, due to the rotation of fourth sprocket 34, replenishment tape T2 is started to be indexed following the tail end of conveyance tape T1.

Figure 11:
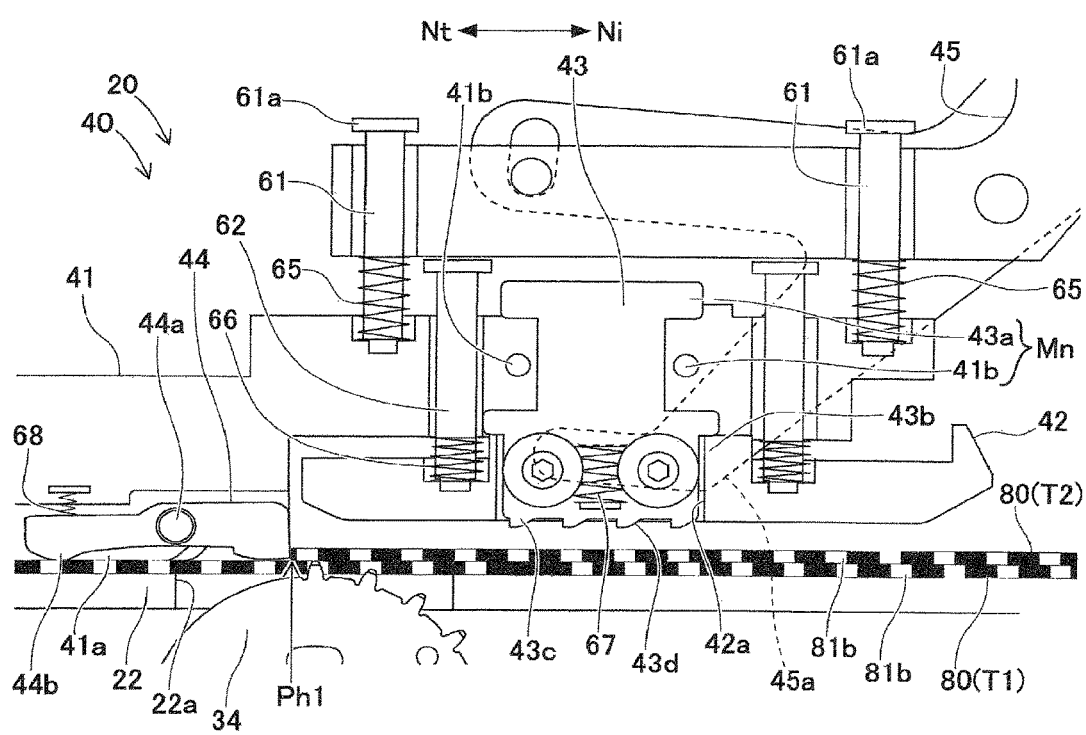
FIG. 11 shows a state with an operation force being applied to the release lever.

Imagining that at this point, operation force is applied to release lever 45 with engaging member 43 in a state engaged with indexing holes 81b of carrier tape 80 (refer to FIG. 10). According to the operation force, release lever 45 is rotated around an axis line of a rotation shaft against the elastic force of a torsion spring. By this, as shown in FIG. 11, release lever 45 moves up assisting member 42 that is connected to leg sections 45a.

When this occurs, engaging member 43 for which second rim section 43b is contacting the upper surface of assisting member 42 moves up together with assisting member 42. By this, claws 43c of engaging member 43 separate from indexing holes 81b of replenishment tape T2. The restriction of movement of replenishment tape T2 towards the insertion section Ni side due to engaging member 43 is released. Therefore, an operator is able to remove replenishment tape T2 to the insertion section Ni side by adding an operation force to release lever 45.

Effects According to the Embodiment

Feeder 20 of the current embodiment rotates sprockets 31 to 34 that engage with indexing holes 81b formed at regular intervals in the conveyance direction of carrier tape 80 so as to index carrier tape 80 inserted into insertion section Ni in the conveyance direction along rail 22. Feeder 20 is provided with pushing member 41 that is movable in a vertical direction perpendicular to the conveyance direction and that pushes carrier tape 80 against rail 22 when at a position (pushing position Pv2) moved up from initial position Pv1, engaging member 43 that is engageable with indexing holes 81b of carrier tape 80 at a position further to the insertion section Ni side than contact position 41a at which pushing member 41 contacts carrier tape 80, and interlocking mechanism Mn that moves engaging member 43 upwards by interlocking with the upwards movement of pushing member 41. When the leading end of carrier tape 80 is positioned further towards the insertion section Ni side than contact portion 41a, and carrier tape 80 is interposed between engaging member 43 and rail 22, engaging member 43 engages with indexing holes 81b of carrier tape 80 such that movement of carrier tape 80 towards the insertion section Ni side is restricted. When pushing member 41 pushes carrier tape 80 against rail 22, interlocking mechanism Mn moves engaging member 43 upwards by interlocking with the upwards movement of pushing member 41, such that engaging member 43 is separated from indexing holes 81b of carrier tape 80, thereby allowing carrier tape 80 to move in the conveyance direction.

According to this configuration, feeder 20 prevents carrier tape 80 from coming out by engaging member 43 engaging with indexing holes 81b of carrier tape 80 inserted to specified position Ph1 (refer to FIGS. 8 and 10). Accordingly, for example, even if load is applied in a removal direction on replenishment tape T2 while it is in a standby state waiting to be indexed in feeder 20, replenishment tape T2 is reliably held in position.

Also, when pushing member 41 pushes carrier tape 80 against rail 22, feeder 20 separates engaging member 43 from indexing holes 81b of carrier tape 80. This allows the movement of carrier tape 80 in the conveyance direction. That is, as shown in FIGS. 9 and 10, in tape indexing unit 40, the configuration is such that engaging member 43 does not engage with conveyance tape T1 which pushing member 41 is pushing against rail 22. Thus, operation of engaging member 43 does not impede indexing of conveyance tape T1.

Feeder 20 is further provided with assisting member 42 that is movable in a vertical direction and that pushes carrier tape 80 against rail 22 at a position further to the insertion section Ni side than contact portion 41a at which pushing member 41 contacts carrier tape 80. Engaging member 43 is provided on assisting member 42 so as to be engageable with indexing holes 81b of carrier tape 80 in the range (contact range Rc shown in FIG. 9) in the conveyance direction in which assisting member 42 contacts carrier tape 80.

According to such a configuration, engaging member 43 engages with carrier tape 80 in contact range Rc at which assisting member 42 pushes carrier tape 80 against rail 22.

By this, the raising of carrier tape 80 is prevented, and engaging member 43 reliably engages with indexing holes 81*b* of carrier tape 80. Thus, movement of carrier tape 80 towards the insertion section Ni side is restricted and carrier tape 80 is reliably prevented from being removed.

Also, when pushing member 41 is pushing first carrier tape 80 (conveyance tape T1) against rail 22, assisting member 42 pushes second carrier tape 80 (replenishment tape T2), which has been inserted into insertion section Ni to be on top of the first carrier tape 80, to the rail 22 side. When the leading end of the second carrier tape 80 (replenishment tape T2) is positioned further towards the insertion section Ni side than contact portion 41*a*, and the second carrier tape 80 (replenishment tape T2) is interposed between engaging member 43 and rail 22, engaging member 43 engages with indexing holes 81*b* of the second carrier tape 80 (replenishment tape T2) such that movement of the second carrier tape 80 (replenishment tape T2) towards the insertion section Ni side is restricted.

According to such a configuration, with feeder 20, which is a non-splicing feeder, from the two carrier tapes 80 that are layered one on top of the other, only the upper carrier tape, replenishment tape T2, is prevented from being removed. The lower carrier tape, conveyance tape T1, is not engaged with engaging member 43, so is allowed to move in the conveyance direction. Thus, operation of engaging member 43 does not impede indexing of conveyance tape T1.

Also, engaging member 43 moves up by interlocking with the upwards movement of assisting member 42 after assisting member 42 has moved up relative to pushing member 41 by stipulated amount L1, and engages with indexing holes 81*b* of carrier tape 80 only by an amount corresponding to stipulated amount L1.

According to such a configuration, the amount that engaging member 43 protrudes from the lower surface of assisting member 42 is set as stipulated amount L1. Thus, when engaging member 43 is engaged with carrier tape 80, the engagement amount of engaging member 43 that is inserted into indexing holes 81*b* is adjusted. Thus, feeder 20 maintains the engagement amount required to restrict movement of carrier tape 80 to the insertion section Ni side. Also, excessive engagement of engaging member 43 in indexing holes 81*b* of carrier tape 80 is prevented, such that any adverse effect on operation such as indexing operation of carrier tape 80 is curtailed.

Also, inclined surface 43*d*, which inclines downwards at the portion on insertion section Ni that contacts carrier tape 80 to be indexed in a state engaged with indexing holes 81*b* of carrier tape 80, is formed on engaging member 43.

According to such a configuration, in a case in which carrier tape 80 is taken out and indexed to removal section Nt and a load is applied in the conveyance direction at the contact point with carrier tape 80, engaging member 43 converts a portion of the load into upwards load. By this, engaging member 43 is moved upwards against the biasing force that biases engaging member 43 downwards. Thus, in a case in which carrier tape 80 is indexed to the removal section Nt side, engaging member 43 allows that indexing. Accordingly, indexing of replenishment-use carrier tape 80 to specified position Ph1 is not obstructed.

Further, feeder 20 is also provided with a releasing member that is directly or indirectly connected to engaging member 43 and that forcibly moves engaging member 43 upwards when receiving an operation force. The releasing member (release lever 45), when an operation force is applied, separates engaging member 43 from indexing holes 81*b* of carrier tape 80, thus allowing carrier tape 80 to move in the conveyance direction.

According to such a configuration, when operation force is applied to release lever 45, regardless of the state of pushing member 41, engaging member 43, or carrier tape 80, movement of carrier tape 80 in the conveyance direction is allowed. Thus, for example, in a case in which it is necessary to exchange replenishment tape T2 that has been inserted to and is being held at specified position Ph1, the removal prevention of replenishment tape T2 is able to be canceled.

Alternative Embodiment

In the above embodiment, interlocking mechanism Mn is configured from protruding sections 41*b* of pushing member 41 and first rim section 43*a* of engaging member 43. However, interlocking mechanism Mn may take a different form so long as engaging member 43 is moved up by interlocking with the upwards movement of pushing member 41. Also, interlocking mechanism Mn may include a connecting member between pushing member 41 and engaging member 43, with engaging member 43 being moved by the connecting member.

Feeder 20 is provided with assisting member 42 that pushes replenishment tape T2 against rail 22. The purpose of this configuration is for feeder 20, which is a non-splicing feeder, to hold replenishment tape T2 at a position further to the insertion section Ni side than contact portion 41*a* of pushing member 41. However, the configuration may be such that assisting member 42 is not provided on feeder 20, and removal of carrier tape 80 may be prevented by engaging member 43 that moves by interlocking with upwards movement of pushing member 41.

Also, assisting member 42 may also be applied to a feeder other than a non-splicing feeder. In this case, assisting member 42, for example, may be provided to prevent removal of carrier tape 80 inserted into feeder 20 during changeover work or the like. By this, feeder 20 is able to reliably hold carrier tape 80, the leading end only of which has been inserted, until power is turned on to the feeder and indexing of carrier tape 80 started. Such a configuration is especially useful in a case in which, as with this embodiment, with respect to feeder 20 set in slot 3*a* of component supply device 3 of component mounter 1, changeover work is performed in which carrier tape 80 is inserted after having been appropriately selected from reel holding section 4 based on the board product being produced.

Also, engaging member 43 is arranged in tape indexing unit 40 positioned at the insertion section Ni side of feeder 20. Here, for feeder 20, so long as engaging member 43 is positioned at the insertion section Ni side with respect to pushing member 41 that pushes carrier tape 80 against rail 22, engaging member 43 may be provided on rail 22 at any position in the conveyance direction.

For example, in a case in which there is a member that pushes carrier tape 80 against rail 22 from above first sprocket 31 and second sprocket 32, feeder 20 may have a configuration in which engaging member 43 is provided on the insertion section Ni side of the member. The same effects are achieved with this embodiment as with the first embodiment. For example, feeder 20 is able to prevent carrier tape 80 from being removed in a case in which a sprocket is reverse rotated such that carrier tape 80 is ejected to a position further to the insertion section Ni side than contact portion 41*a* of pushing member 41.

Also, in the first embodiment, feeder 20 is provided with release lever 45, which is rotatably supported on case 21, as a release member that forcibly moves engaging member 43 upwards. Release lever 45 is indirectly connected to engaging member 43 via assisting member 42. With this configuration, prevention of removal of carrier tape 80 by engaging member 43 interlocking with the upwards movement of assisting member 42 is released as the pressure imparted on carrier tape 80 by assisting member 42 is released.

In contrast to this, it is possible to use a configuration in which release lever 45 is directly connected to engaging member 43. For example, leg sections 45a and engaging member 43 may be connected by a connecting member. With this, operation of release lever 45 is directly transmitted to engaging member 43. Thus, in a case in which an operation force is applied to release lever 45, engaging member 43 is moved up immediately.

REFERENCE SIGNS LIST

1: component mounter; 2: board conveyance device; 3: component supply device; 3a: slot; 4: reel holding section; 5: component transfer device; 6: control device; 11: head driving device; 12: mounting head; 20: feeder; 21: case; 22: rail; 22a: window; 31: first sprocket; 32: second sprocket; 33: third sprocket; 34: fourth sprocket; 40: tape indexing unit; 41: pushing member; 41a: contact portion; 41b: protruding section; 42: assisting member; 42a: slide groove; 43: engaging member; 43a: first rim section; 43b: second rim section; 43c: claw section; 43d: inclined surface; 44: stopper member; 44a: rotation shaft; 44b: projecting section; 45: release lever (releasing member); 50: tape peeling unit; 61: first shaft; 61a: flange; 62: second shaft; 62a: flange; 65: first coil spring; 66: second coil spring; 67: third coil spring; 68: fourth spring; 71: first reel; 72: second reel; 80: carrier tape; 81: base tape; 81a: component storage section; 81b: indexing hole; 82: cover tape; Bd: board; Nt: removal section; Ni: insertion section; Mn: interlocking mechanism; T1: conveyance tape (first carrier tape); T2: replenishment tape (second carrier tape); Pv1: initial position; Pv2: pushing position; Ph1: specified position; Rc: contact range (of assisting member and tape); L1: stipulated amount

The invention claimed is:

1. A feeder comprising:
a sprocket that engages with indexing holes formed at regular intervals in a conveyance direction of carrier tape, the sprocket rotating so as to index the carrier tape inserted into an insertion section in the conveyance direction along a rail;
a pushing member provided moveably in a vertical direction perpendicular to the conveyance direction that pushes the carrier tape against a rail from an initial position to an upstream position;
an engaging member that engages with the indexing holes of the carrier tape at a position further to the insertion section side than a contact portion at which the pushing member contacts the carrier tape; and
an interlocking mechanism that moves the engaging member up by interlocking with movement up of the pushing member; wherein the engaging member, when a leading end of the carrier tape is positioned at a position further to the insertion section side than the contact portion and the carrier tape is interposed between the engaging member and the rail, engages with the indexing holes of the carrier tape so as to restrict the movement of the carrier tape to the insertion section side, and
the interlocking mechanism, when the pushing member is pushing the carrier tape against the rail, releases the engaging member from the indexing holes of the carrier tape, so as to allow movement of the carrier tape in the conveyance direction, by moving the engaging member up by interlocking with movement up of the pushing member.

2. The feeder according to claim 1, further provided with an assisting member provided movably in the vertical direction that pushes the carrier tape against the rail at a position further to the insertion section side than the contact portion of the pushing member,
wherein the engaging member is provided on the assisting member so as to be engageable with the indexing holes of the carrier tape in a range in the conveyance direction in which the assisting member contacts the carrier tape.

3. The feeder according to claim 2, wherein
the assisting member, when the pushing member is pushing a first carrier tape against the rail, pushes a second carrier tape inserted from the insertion section on top of the first carrier tape at the rail side, and
the engaging member, when the leading of the second carrier tape is positioned further to the insertion section side than the contact portion and the second carrier tape is between the engaging member and the rail, engages with only the indexing holes of the second carrier tape to restrict the movement of the second carrier tape to the insertion section side.

4. The feeder according to claim 2, wherein
the engaging member is moved up by interlocking with the upwards movement of the assisting member after the assisting member has moved up relative to the pushing member by a stipulated amount, and engages with the indexing holes of the carrier tape only by an amount corresponding to the stipulated amount.

5. The feeder according to claim 1, further provided with the engaging member includes an inclined surface that inclines downwards at the point on the insertion section side that contacts the carrier tape that is indexed in a state with the engaging member engaged with the indexing holes of the carrier tape.

6. The feeder according to claim 1, further provided with a releasing member, connected directly or indirectly to the engaging member, that receives an operation force to forcibly raise up the engaging member,
wherein the releasing member, when subjected to the operation force, releases the engaging member from the indexing holes of the carrier tape and allows movement of the carrier tape in the conveyance direction.

* * * * *